US012557297B2

United States Patent
Rizzolo et al.

(10) Patent No.: US 12,557,297 B2
(45) Date of Patent: Feb. 17, 2026

(54) LEVELING DIELECTRIC SURFACES FOR CONTACT FORMATION WITH EMBEDDED MEMORY ARRAYS

(71) Applicant: International Business Machines Corporation, Armonk, NY (US)

(72) Inventors: Michael Rizzolo, Delmar, NY (US); Devika Sarkar Grant, Rensselaer, NY (US); Son Nguyen, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 648 days.

(21) Appl. No.: 17/454,570

(22) Filed: Nov. 11, 2021

(65) Prior Publication Data

US 2023/0146034 A1    May 11, 2023

(51) Int. Cl.
  *H10B 63/00*    (2023.01)
  *H10B 61/00*    (2023.01)
  (Continued)

(52) U.S. Cl.
  CPC ............. *H10B 63/80* (2023.02); *H10B 61/00* (2023.02); *H10N 50/01* (2023.02); *H10N 50/80* (2023.02);
  (Continued)

(58) Field of Classification Search
  CPC ........ H10B 61/00; H10B 63/00; H10B 63/10; H10N 50/80
  (Continued)

(56) References Cited

U.S. PATENT DOCUMENTS

| 6,130,126 A | 10/2000 | Takashi |
| 6,709,926 B2 | 3/2004 | Chidambarrao |

(Continued)

FOREIGN PATENT DOCUMENTS

| CN | 118235536 A | 6/2024 |
| EP | 4430931 A1 | 9/2024 |
| WO | 2023/083585 A1 | 5/2023 |

OTHER PUBLICATIONS

Disclosed Anonymously et al., "MRAM Top Contact Structure", IP Com Prior Art Database Technical Disclosure, IPCOM000263714D, Sep. 29, 2020, pp. 1-12.
(Continued)

*Primary Examiner* — Fazli Erdem
(74) *Attorney, Agent, or Firm* — Gavin Giraud

(57) ABSTRACT

An approach providing a semiconductor structure that provides a self-leveling, flowable, dielectric material for a gap fill material between vertical structures in many emerging non-volatile memory devices that are being formed with vertical structures for increasing memory device density. The semiconductor structure provides a flat dielectric surface between a plurality of contacts in a back end of the line metal layer in both the memory region and in the logic region of the semiconductor structure. The semiconductor structure includes a first portion of the plurality of contacts that each connect to a pillar-based memory device in an array of pillar-based memory devices. The first portion of the contacts that each connect to a pillar-based memory device in the array of memory devices reside in a conventional interlayer dielectric material under the self-leveling dielectric material. The flowable, self-leveling material provides a flat dielectric surface during contact formation.

19 Claims, 7 Drawing Sheets

(51) Int. Cl.
  *H10N 50/01* (2023.01)
  *H10N 50/80* (2023.01)
  *H10N 70/00* (2023.01)
(52) U.S. Cl.
  CPC ......... *H10N 70/011* (2023.02); *H10N 70/841* (2023.02)
(58) Field of Classification Search
  USPC .............................................................. 257/5
  See application file for complete search history.

(56) References Cited

U.S. PATENT DOCUMENTS

| | | | |
|---|---|---|---|
| 9,013,045 B2 | 4/2015 | Satoh | |
| 9,997,562 B1* | 6/2018 | Wang | ..................... H10B 61/00 |
| 10,510,587 B2 | 12/2019 | Huang | |
| 10,811,595 B2 | 10/2020 | Lee | |
| 10,833,257 B1 | 11/2020 | Dutta | |
| 2016/0181268 A1* | 6/2016 | Chuang | ................. H10D 84/85 |
| | | | 438/587 |
| 2017/0092693 A1 | 3/2017 | Tan | |
| 2018/0309051 A1* | 10/2018 | Deshpande | ........... H01L 21/768 |
| 2019/0115223 A1* | 4/2019 | Hsieh | ................ H01L 21/31055 |
| 2019/0165042 A1* | 5/2019 | Clevenger | .............. H10N 50/01 |
| 2019/0229261 A1* | 7/2019 | Hsieh | ..................... H10N 50/01 |
| 2020/0028067 A1* | 1/2020 | Jiang | ..................... H10B 61/00 |
| 2020/0098976 A1 | 3/2020 | Jacob | |
| 2020/0194496 A1 | 6/2020 | Hsieh | |
| 2021/0091302 A1 | 3/2021 | Reznicek | |
| 2021/0134668 A1* | 5/2021 | Huang | ..................... H10B 61/22 |
| 2022/0158087 A1* | 5/2022 | Kuo | ..................... H10N 50/80 |
| 2022/0310697 A1* | 9/2022 | Wang | ..................... H10B 61/00 |

OTHER PUBLICATIONS

Edelstein et al., "A 14 nm Embedded STT-MRAM CMOS Technology" IBM Research Albany NY, pp. 1-4.
Reznicek et al., "MRAM Devices Containing A Harden Gap Fill Dielectric Material" U.S. Appl. No. 16/579,300, filed Sep. 23, 2019.
International Searching Authority, "Notification of Transmittal of the International Search Report and the Written Opinion of the International Searching Authority, or the Declaration", International application No. PCT/EP2022/079414, International Filing Date Oct. 21, 2022, Mailed on Feb. 17, 2023, 11 pages.

* cited by examiner

LEVELING DIELECTRIC SURFACES FOR CONTACT FORMATION WITH EMBEDDED MEMORY ARRAYS

BACKGROUND OF THE INVENTION

The present invention relates generally to the field of semiconductor technology and more particularly to forming contacts in semiconductor chips with pillar-based memory arrays adjacent to logic devices.

Increasing computing function today requires both more device circuits and faster processing speeds for computer systems and applications. In particular, the use of deep neural networks is becoming pervasive in many end-use computer applications. Deep neural networks are typically used in artificial intelligence (AI) applications. The training of deep neural networks puts significant demand on the memory systems in computer systems executing AI applications with deep neural networks. Increasing demand for high-performance memory systems continues to drive the development of new and advanced memory devices in memory chips.

Non-volatile memory (NVM) or non-volatile storage is a type of computer memory that can retain stored information even after power is removed. Non-volatile memory typically refers to storage in semiconductor memory chips which typically store data in floating-gate memory cells consisting of floating-gatemetal-oxide-semiconductor field-effect transistors (MOSFETs), including flash memory storage such as NAND flash and solid-state drives (SSD).

Developments in advanced memory devices for NVM include several new technology developments in NVM memory devices. Magnetoresistive random-access memory (MRAM) is a type of non-volatile random-access memory that stores data in magnetic domains using magnetic tunnel junctions (MTJs) formed with multiple thin layers of magnetic and non-magnetic stacked materials. Resistive random-access memory (RRAM or ReRAM) devices work by changing the resistance across a dielectric solid-state material. Phase change random-access memory (PCRAM or PCM) uses phase change materials, which typically have at least two phases, a crystalline phase, and an amorphous phase, with very different electrical properties for set and re-set states to store and retrieve data.

The demand for high-performance memory systems in current computer applications also drives an increasing density of memory devices. Decreasing the pitch, or space between memory devices, both increases the number of available memory devices in a memory chip and increases memory chip performance. Many emerging NVM memory devices are being formed with vertical structures or pillars in pursuit of increasing memory device density.

SUMMARY

Embodiments of the present invention provide a self-leveling, flowable dielectric material for a dielectric gap fill material between vertical structures for many emerging non-volatile memory devices that are being formed with vertical structures or pillars for increasing the memory device density. Embodiments of the present invention use a self-leveling dielectric material to provide a flat dielectric surface of in a memory region and in a logic region of a semiconductor structure prior to and after device contact formation. A first portion of a plurality of contacts each connect to a pillar-based memory device in an array of pillar-based memory devices that reside in the memory region of the semiconductor structure. Embodiments of the present invention disclose that the array of pillar-based memory devices is composed of one of an array of magnetoresistive random-access memory devices, an array of resistive random-access memory devices, or an array of phase change random-access memory devices. The self-leveling dielectric material provides the flat dielectric surface that is without back end of the line metal in the memory region, in the logic region, and in a transitional area between the memory region and the logic region of the semiconductor structure.

A second conventional interlayer dielectric material is over the self-leveling dielectric material. The first portion of the plurality of contacts in the memory region have vertical sides that are covered by the second conventional interlayer dielectric material while the contacts in the logic region of the semiconductor structure reside in the self-leveling dielectric material. A wedge-shaped portion of the self-leveling dielectric is between the sides of the second dielectric material that surrounds each of contact of the plurality of contacts to adjacent pillar-based memory devices in the array of pillar-based memory devices.

Embodiments of the present invention provide the semiconductor structure with one or more portions of a first metal layer in a first dielectric material. One or more portions of the first metal reside in the logic region and in the memory region of the semiconductor structure. A first portion of the first metal layer in the first dielectric material is under each pillar-based memory device in the array of pillar-based memory devices in the memory region. Embodiments of the present invention include the array of pillar-based memory devices where each array is composed of one of magnetoresistive random-access memory devices, resistive random-access memory devices, or phase change random-access memory devices. Embodiments of the present invention provide the semiconductor structure that includes an encapsulation dielectric material surrounding each pillar-based memory device in the array of memory pillar-based memory devices in the memory region. The encapsulation dielectric material is also above one or more portions of the first metal layer and the first dielectric material in the logic region.

Embodiments of the present invention include a second conventional interlayer dielectric material that is over the encapsulation dielectric material and between adjacent contacts to each pillar-based memory device in the array of memory devices. The contacts to each pillar-based memory device are formed in a second metal layer that is above the array of pillar-based memory devices. The second conventional interlayer dielectric material is over the encapsulation dielectric material in the logic region and surrounds a bottom portion of the contacts formed from the second metal layer in the logic region of the semiconductor structure. Additionally, embodiments of the present invention include a self-leveling dielectric material that is over the second conventional interlayer dielectric material in the logic region. The self-leveling dielectric material surrounds a top portion the contacts in the logic region of the semiconductor structure. The self-leveling dielectric provides a flat dielectric surface of the semiconductor structure prior to contact formation.

Embodiments of the present invention provide another semiconductor structure with a first interlayer dielectric material that has a flat surface between a plurality of portions of a back end of line metal layer. Each portion of the plurality of portions of the back end of the line metal layer in a memory region of the semiconductor structure connects to a pillar-based memory device in an array of pillar-based memory devices. A self-leveling dielectric material is under the first interlayer dielectric material and the plurality of portions of the back end of line metal layer. The self-leveling dielectric material resides under the plurality of portions of the back end of the line metal layer and the first interlayer dielectric. Embodiments of the present invention provide a flowable dielectric material for the self-leveling dielectric material. The self-leveling dielectric material resides on an encapsulation material in the logic region and the memory region of the semiconductor structure. The self-leveling dielectric material on the encapsulation dielectric material fills the gaps between adjacent pillar-based memory devices. The self-leveling dielectric material provides a flat surface for deposition of the first interlayer dielectric material during contact formation to prevent smeared contact metal on the first interlayer dielectric material after contact formation. The flowable, self-leveling dielectric material provides a void-free gap fill between pillar-based memory devices in the array of memory devices and a flat dielectric surface for contact formation.

Embodiments of the present invention provide a method of forming a semiconductor structure with the flat top surface of a self-leveling dielectric material between a plurality of contacts to an array of pillar-based memory devices and one or more contacts to one or more logic devices in a logic region of the semiconductor structure. The method includes depositing a first dielectric material over an encapsulation dielectric material covering a logic region of a semiconductor structure and a memory region of the semiconductor structure. The memory region includes one or more pillar-based memory devices that are each on a portion of a first metal layer. The method includes depositing a self-leveling dielectric material over the first dielectric material. The self-leveling second dielectric material is deposited using a vacuum plasma chemical vapor deposition process with one or more of an organosilicon precursor or an oxygen precursor to deposit the self-leveling second dielectric material. The self-leveling second dielectric material is a flowable, low-k dielectric material. The method includes performing a chemical mechanical polish that removes a top portion of the self-leveling second dielectric material and a top portion of the first dielectric material in the memory region. After the chemical mechanical polish, the top surfaces of the first dielectric material and the self-leveling second dielectric material are flat and level. The method includes forming one or more contacts in a second metal layer. A first portion of the one or more contacts in the memory region are formed in the first dielectric material and a second portion of the one or more contacts are formed in the self-leveling second dielectric material in the logic region of the semiconductor structure. The top surface of the self-leveling second dielectric material is flat and without any residual back end of the line metal material.

BRIEF DESCRIPTION OF THE DRAWINGS

The above and other aspects, features, and advantages of various embodiments of the present invention will be more apparent from the following descriptions taken in conjunction with the accompanying drawings.

DETAILED DESCRIPTION

Figure 1:
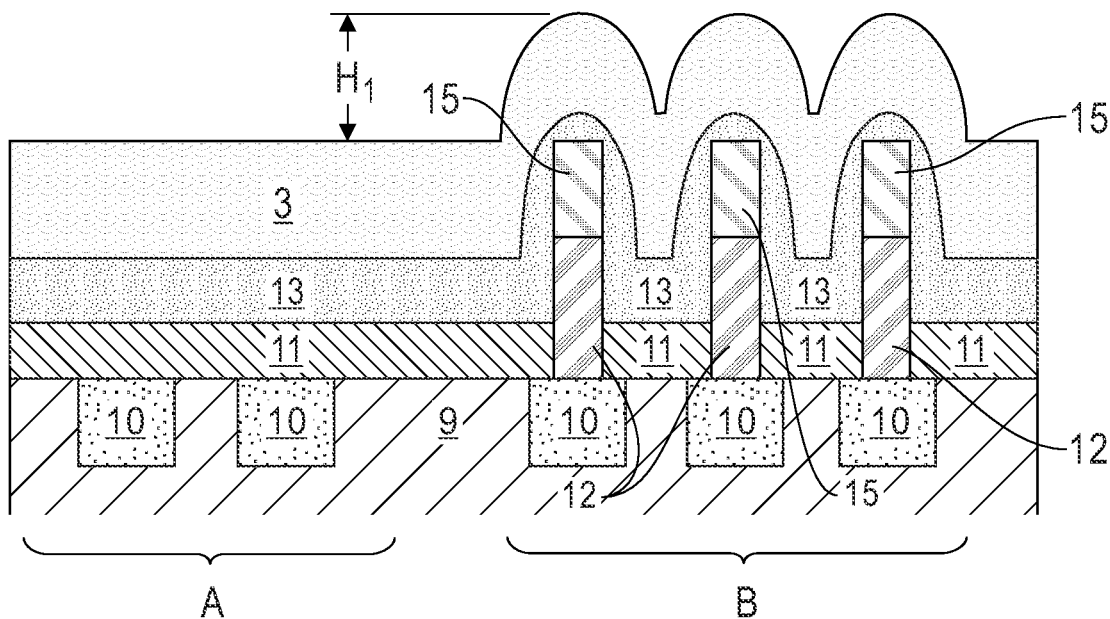
FIG. 1 is a cross-sectional view of a portion of a semiconductor structure with a logic region and a memory region, in accordance with an embodiment of the present invention.

Embodiments of the present invention recognize that during the formation of advanced memory devices using vertical, pillar-based memory structures with non-pillar-based logic devices, circuits, and macros creates challenges in providing a level surface of interlayer dielectric materials during back end of the line (BEOL) interconnect layer formation. Embodiments of the present invention recognize that the ability to provide a level interlayer dielectric material surface height within a semiconductor structure with one or more arrays of pillar-based memory structures and one or more adjacent regions of logic devices, circuits, and/or macros that are not formed with vertical, pillar-based structures, is difficult.

Embodiments of the present invention recognize that an inability to provide a level or flat surface for the interlayer dielectric material between and within the areas with arrays of pillar-based memory devices and in adjacent areas above non-pillar-based logic devices can create BEOL metal shorting after contact formation to the array of pillar-based memory devices. Non-level surfaces or uneven surfaces of the interlayer dielectric material can cause puddling or smearing of BEOL metal materials after contact formation in the metal layer directly above and connecting to the pillars in the array of pillar-based memory devices. Specifically, using chemical mechanical polishing for the planarization of the metal layer deposited on the interlayer dielectric material during contact formation above each of the pillar-based memory devices and line and contact formation above the logic device area can cause the smearing or incomplete removal of the contact metal. The incomplete removal of the BEOL metal forming the contacts typically occurs when the surface of the interlayer dielectric material above the arrays of pillar-based memory structures is higher than the surface of the interlayer dielectric material above the adjacent logic devices. When the top surface of the interlayer dielectric material is uneven prior to and during contact formation for the array of pillar-based memory devices or cells and line formation above the logic devices, then portions of the BEOL metal forming may be captured in the uneven interlayer dielectric surface or the dip in the interlayer dielectric material between the higher surface of the interlayer dielectric material over the arrays of the pillar-based memory structures and the lower surface of the interlayer dielectric material residing over the logic devices adjacent to the arrays of the pillar-based memory devices. The smeared BEOL metal in uneven regions of the interlayer dielectric can cause one or more hard shorts after BEOL interconnect layer formation (e.g., after the BEOL metal layer planarization for contact and line formation).

Embodiments of the present invention recognize that the methods to form a flat or level surface of the interlayer dielectric material in semiconductor structures with arrays of pillar-based memory structures that are adjacent to regions of non-pillar-based logic devices is further complicated by different densities or pillar to pillar pitch within the various arrays of pillar-based memory devices. Embodiments of the present invention recognize that methods and structures that provide co-planar interlayer dielectric surfaces inside and outside of the arrays of pillar-based memory structures prior to and after forming contacts connecting to each pillar-based memory cell in an array of pillar-based memory cells or devices would be desirable. Additionally, embodiments of the present invention recognize that methods and semiconductor structures consistently providing a level dielectric material surface or a flat interlayer dielectric material surface consistently across different types of pillar-based memory structures with different design ground rules and different pillar to pillar pitch during BEOL interconnect formation would be desirable.

Embodiments of the present invention provide the semiconductor structures and the methods of forming semiconductor structures with a flat or level interlayer dielectric (ILD) material surface prior to and during the creation of contacts in an interlayer dielectric that are directly above and connected to one or more pillar-based memory structures, adjacent logic devices, circuits, and macros. In embodiments, the methods of forming some of the various semiconductor structures use a self-leveling, flowable chemical vapor deposition (CVD) of SiCOH at low temperature, as a self-leveling, low-k dielectric material in combination with a traditional or non-self-leveling dielectric material. The self-leveling, low-k dielectric material is not limited to SiCOH and may be another low-k dielectric material (e.g., a dielectric material with a dielectric constant less than 4) in other embodiments. The self-leveling, low-k dielectric material can be considered as an interlayer dielectric material in embodiments of the present invention.

Embodiments of the present invention a deposition process for the self-leveling, low-k dielectric material which includes depositing the self-leveling, low-k dielectric material using a vacuum plasma chemical vapor deposition process. The vacuum plasma chemical vapor deposition can utilize one or more of organosilicon and oxygen precursors at low temperatures (e.g., 50-100 degrees C.) to maintain self-leveling and flowability of the low-k dielectric material. Material hardening of the self-leveling, low-k dielectric material is achieved in embodiments of the present invention with a UV cure at higher temperatures (e.g., 150-450 degrees C.). Furthermore, embodiments of the present invention include a chemical mechanical polish (CMP) of the self-leveling, low-k dielectric material to provide a level or flat top surface for the semiconductor structure prior to contact formation for the pillar-based memory structures and contact formation above one or more of the logic devices. The pillar-based memory structures can reside on a portion of a BEOL or a middle of the line (MOL) metal layer, which may be a Mx metal layer (e.g., M1 metal layer, M2 metal layer, etc.).

The methods provided include a maskless process for ILD topography removal using a self-leveling, flowable dielectric material with a conventional interlayer dielectric material (e.g., not a self-leveling dielectric material deposited by plasma CVD, etc.) to provide a level or flat ILD top surface above pillar-based memory structures. In one embodiment, the maskless process involves first depositing a conventional, non-leveling ILD material around the NVM pillars with a thickness that extends the top surface of the conventional ILD above the NVM pillars. Second a sacrificial, self-planarizing (e.g., flowable) dielectric material is deposited on top of the conventional ILD to improve the planarity within and outside the NVM array. Next CMP of the sacrificial, self-planarizing dielectric material is performed to polish away the self-leveling dielectric. The CMP stops within the conventional ILD at the appropriate distance from the NVM pillar as dictated by integration requirements/process assumptions to form contacts to the NVM pillars. The method does not require the additional use of masks or additional mask levels. Upon completion of the method, the conventional ILD height or thickness and next level metal layer above and contacting the pillar-based memory structure are not changed.

Embodiments of the present invention provide several methods to form semiconductor structures with a flat ILD surface directly above and between one or more arrays of pillar-based memory devices and adjacent areas above of non-pillar-based logic devices prior to forming the contacts and lines in a metal layer that is above the pillar-based memory structures and logic devices. The methods for producing the semiconductor structures with the flat or level ILD surface prior to BEOL metal contact formation on the pillars of the pillar-based memory structures reduces BEOL metal smearing during the CMP process that can occur in BEOL contact formation. As previously discussed, the flat ILD surface prevents hard shorts caused by smeared BEOL metal during memory device contact formation, which can be captured in dips or transitional areas between the higher ILD surface above the arrays of pillar-based memory structures and the lower ILD surface in conventionally formed memory devices without a flat ILD surface prior to and during contact formation.

Embodiments of the present invention provide a semiconductor structure where the ILD directly above one or more arrays of pillar-based memory structures has a surface height that is the same as the ILD surface height above in the area with one or more non-pillar-based logic devices. The use of the self-leveling, low-k dielectric material in the semiconductor structure enables the formation of level ILD surfaces with the same surface height in the arrays of pillar-based memory structures, in transitional areas between the arrays of pillar-based memory structures and the logic devices, as well as in the ILD surface above the logic device area. Embodiments of the present invention provide semiconductor structures where the pillar-based memory structures can be for any type of pillar-based memory devices including magnetoresistive random-access memory (MRAM) devices, phase-change memory (PCM) devices, resistive random-access memory (RRAM) devices, and other pillar-based memory devices. Embodiments of the present invention include pillar-based memory structures for MRAM devices. PCM devices, and RRAM devices can be used as non-volatile memory in the semiconductor device.

Embodiments of the present invention provide a method forming a semiconductor structure without hard shorts caused by smeared BEOL metal on an uneven ILD surface between pillar-based memory structures and logic devices. The method creates a level ILD surface both within and outside of the pillar-based memory structures. The method includes using conventional BEOL metallization processes or damascene processes to form a bottom contact or a line in a portion of a BEOL or MOL metal layer, such as a Mx metal layer which may be a M1 metal layer or a M2 metal layer. One or more contacts can be formed in each portion of the Mx metal layer in a memory region of the semiconductor structure on a semiconductor substrate.

Embodiments of the present invention use conventional pillar formation processes for memory devices, such as depositing the layers of materials for the bottom electrode and materials for one or more magnetic tunneling junctions (MTJs) or layers of materials for one or more phase change memory cells, or layers of materials for RRAM devices, and selectively etching the layers of materials (e.g., using patterning and a reactive ion etch). After the selective etching, a pillar-based memory structure for one of a MRAM, a PCM, or a RRAM memory cell or device is formed in various embodiments of the present invention. An encapsulation material is deposited over the semiconductor structure (e.g., over the pillar-based memory structures in the memory region of the semiconductor structure and over the area adjacent to a logic region of the semiconductor structure) in embodiments of the present invention.

Embodiments of the present invention include the methods of forming the semiconductor structures by depositing one of a thinner layer of ILD material, a thicker layer of ILD material, or a self-leveling dielectric material over the encapsulation material where the encapsulation material is over one or more pillar-based memory structures which can be in an array of pillar-based memory structures and is above one or more logic devices in a region adjacent to the pillar-based memory. The surface of the ILD material is higher in the memory region above the pillar-based memory structures than the surface of the ILD above the logic devices.

After depositing the ILD material, in embodiments of the present invention with the deposited ILD material, a layer of the self-leveling dielectric material is deposited by a chemical vapor deposition process. The self-leveling dielectric material is a flowable, low-k dielectric material that provides a more level surface than the ILD material.

After depositing the self-leveling dielectric material, a CMP occurs to planarize or level the top surface of the semiconductor structure. The CMP occurring in the embodiments of the present invention with the thicker deposited ILD material removes all of the self-leveling dielectric material. The CMP occurring in the embodiments of the present invention with the thinner ILD material removes portions of the self-leveling dielectric material above the logic devices and top portions of the self-leveling dielectric material above the pillars of an array of pillar-based memory structures while leaving portions of the self-leveling dielectric above the logic device region and between adjacent pillars in the array of pillar-based memory structures (see FIG. 3).

The CMP occurring in embodiments of the present invention, with the self-leveling dielectric material on the encapsulation material rather than on the ILD material, removes the top portion of the self-leveling dielectric material above the logic devices while leaving bottom portions of the self-leveling dielectric material in the logic device region and removes the top portion of the self-leveling dielectric material above the pillars in the memory region, and then deposits a layer of the ILD material over the remaining self-leveling dielectric material. In each of these embodiments, after depositing the self-leveling dielectric material, a CMP is performed and after the CMP, the top surface of the semiconductor structure is flat (e.g., the top surface of remaining self-leveling dielectric material and ILD material and/or the top surface of the self-leveling dielectric material). In each embodiment, using known BEOL metallization processes, the contacts to each pillar for each memory device are formed in an ILD material with a flat top surface. The contacts formed on the flat ILD material are formed without BEOL metal smears that can create hard shorts in the metal layer.

Detailed embodiments of the claimed structures and methods are disclosed herein. The method steps described below do not form a complete process flow for manufacturing integrated circuits, such as semiconductor devices. The present embodiments can be practiced in conjunction with the integrated circuit fabrication techniques currently used in the art, for advanced semiconductor devices, such as advanced semiconductor devices using twenty-five nanometer or less design features, and only so much of the commonly practiced process steps are included as are necessary for an understanding of the described embodiments. The figures represent cross-section portions of a logic region and a memory region of a semiconductor device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

Deposition processes as used herein include but are not limited to chemical vapor deposition (CVD), plasma vapor deposition (PVD), electroplating, ionized plasma vapor deposition (iPVD), atomic layer deposition (ALD), and plasma-enhanced chemical vapor deposition (PECVD).

As known to one skilled in the art, typical BEOL processes discussed herein include dual damascene, single damascene, and subtractive metal etching processes. Dual damascene process is most commonly used for BEOL patterning and metallization processes. A dual damascene process typically includes patterning via and trench in a dielectric material, such as an interlayer dielectric and filling the via holes and trenches with a deposited layer of metal (e.g., a BEOL metal including but not limited to copper, tungsten, cobalt, or ruthenium) and leveling the metal using a chemical mechanical (CMP) process to remove overburden or excess metal. The single damascene process includes patterning via holes in a first dielectric material, filling the via holes with a deposited metal layer, and then preforming a CMP to remove overburden or excess metal and then depositing a second dielectric material and then, performing a second etch process to form trenches, filling the trenches with metal layers and then performing a CMP to remove the overburden of metal layers. In some embodiments, a subtractive metallization process is used where a metal layer is deposited, patterned, etched, and a dielectric material is deposited over the top surface. A CMP exposes the top surface of the patterned metal.

Patterning processes discussed herein include but are not limited to one of lithography, photolithography, an extreme ultraviolet (EUV) lithography process, or any other known semiconductor patterning process that is followed by one or more of the following etching processes discussed below.

Etching processes discussed herein to remove portions of material as patterned or masked by the lithography process includes etching processes, such as dry etching process using a reactive ion etch (RIE), or ion beam etch (IBE), a wet chemical etch process, or a combination of these etching processes and is not limited to these etching processes.

References in the specification to "one embodiment", "other embodiment", "another embodiment," "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top", "bottom," and derivatives thereof shall relate to the disclosed structures and methods, as oriented in the drawing figures. The terms "overlying," "atop," "over," "on "positioned on," or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined for presentation and illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present.

FIG. 1 is a cross-sectional view of a portion of semiconductor structure 100 with logic region A and memory region B, in accordance with an embodiment of the present invention. As depicted, FIG. 1 includes portions of logic region A, memory region B, Mx metal 10, interlayer dielectric (ILD) 9, cap 11, encapsulation dielectric 13, bottom contact 12, non-volatile memory (NVM) pillars 15, and ILD 3. Bottom contact 12 and NVM pillars 15 can form a pillar-based memory device (e.g., MRAM, PCM, or RRAM). In various embodiments, each of NVM pillars 15 include a top electrode (not depicted in FIG. 1).

H1 is also labelled on FIG. 1. H1 depicts the delta in the height from the top surface of ILD 3 above the NVM pillars 15 to the top surface of ILD 3 in logic region A. For example, a typical value for H1 between the top surface of ILD 3 over NVM pillars 15 and the top surface of ILD 3 in logic region A is typically in the range 20-300 nm. H1 depicts a height change in the top surface of ILD 3 in the transition area between logic region A and memory region B. As observed and previously discussed, in the formation of semiconductor devices with arrays of NVM pillars 15 that are adjacent to a region of non-pillar logic devices, the uneven surface of ILD 3 (depicted in FIG. 1 as H1 indicating a difference in the height of the top surface of ILD 3 in logic region A and the top surface of ILD 3 memory region B), during contact formation in later process steps, can cause copper puddling or smearing during contact formation to NVM pillars 15, via formation in logic region A, and Mx+1 metal line formation. As previously discussed, in conventionally formed semiconductor devices with arrays of pillar-based semiconductor memory devices, when a significant difference in the height of the top surfaces of ILD 3 in logic region A and memory region B occurs (e.g., H1 is large), a hard short due to smeared copper or other BEOL metal in the transitional region between logic region A and memory region B can occur.

Each Mx metal 10 is a portion of a back end of the line (BEOL) or a middle of the line (MOL) metal layer. In various embodiments, Mx metal 10 is a portion of the M1 metal layer. In other embodiments, Mx metal 10 is another metal layer (e.g., M2 metal layer, etc.). ILD 9 is a dielectric material forming an interlayer dielectric around Mx metal 10. For example, ILD 9 may be a low-k dielectric material, such as SiCOH but is not limited to this ILD material.

Cap 11 resides over ILD 9 and the portions of Mx metal 10. In various embodiments, cap 11 is a low-k dielectric material composed of SiNC, SiCNO, a combination of silicon (Si), carbon (C), nitrogen (N), and hydrogen (H), such as a nitrogen-doped silicon carbide, SiN, boron nitride (BN), or any other suitable low-k dielectric cap material for a NVM memory device.

As depicted, encapsulation dielectric 13 covers cap 11 and exposed surfaces of bottom contact 12 and NVM pillars 15 in memory region B. In various embodiments, encapsulation dielectric 13 is composed of SiN but, may be any dielectric material suitable to cover or encapsulate NMV pillars 15, bottom contact 12, and cap 11.

ILD 3 is a dielectric material. For example, ILD 3, which is a Mx+1 metal ILD, can be composed of SiCOH (silicon, carbide, oxygen, and hydrogen) but is not limited to this low-k dielectric material and may be any suitable low-k dielectric material used for an ILD in the formation of NVM devices. ILD 3 can be deposited, for example using physical vapor deposition (PVD), plasma-enhanced chemical vapor deposition (PECVD), or CVD. In this embodiment, ILD 3 is a thinner layer of ILD material than ILD 53 depicted in FIG. 5. For example, the thickness of ILD 3 is approximately 50% to 150% of NVM pillar height, which includes the height of NVM pillars 15 and bottom contact 12.

Bottom contact 12 can be composed of any of the typical BEOL contact metals, such as copper (Cu), tantalum (Ta), titanium (Ti), cobalt (Co), ruthenium (Ru), but is not limited to these metal materials. Bottom contact 12 can be formed with NVM pillars 15 using known semiconductor processes for memory device pillar formation (e.g., bottom contact deposition, pillar material deposition, and a selective etch process).

NVM pillars 15 can be formed from various material layers for NVM memory device formation. In some examples, NVM pillars 15 can be formed with one or more magnetic tunnel junctions (MTJs). In other examples, NVM pillars 15 include pillars formed with one or more layers of a phase change material and other materials or liners used in PCM memory device pillar formation. NVM pillars 15 can be present in the formation of magnetoresistive random-access memory (MRAM) devices, phase-change memory (PCM) devices, resistive random-access memory (ReRAM or RRAM) devices, or any other current or emerging non-volatile memory device technology. For example, a typical height of NVM pillars 15 can range from 25 to 300 nm but is not limited to this range. In various embodiments, NVM pillars 15 form one or more arrays of pillars which may be densely packed or tightly spaced (e.g., less than 40 nm between adjacent NVM pillars 15).

Figure 2:
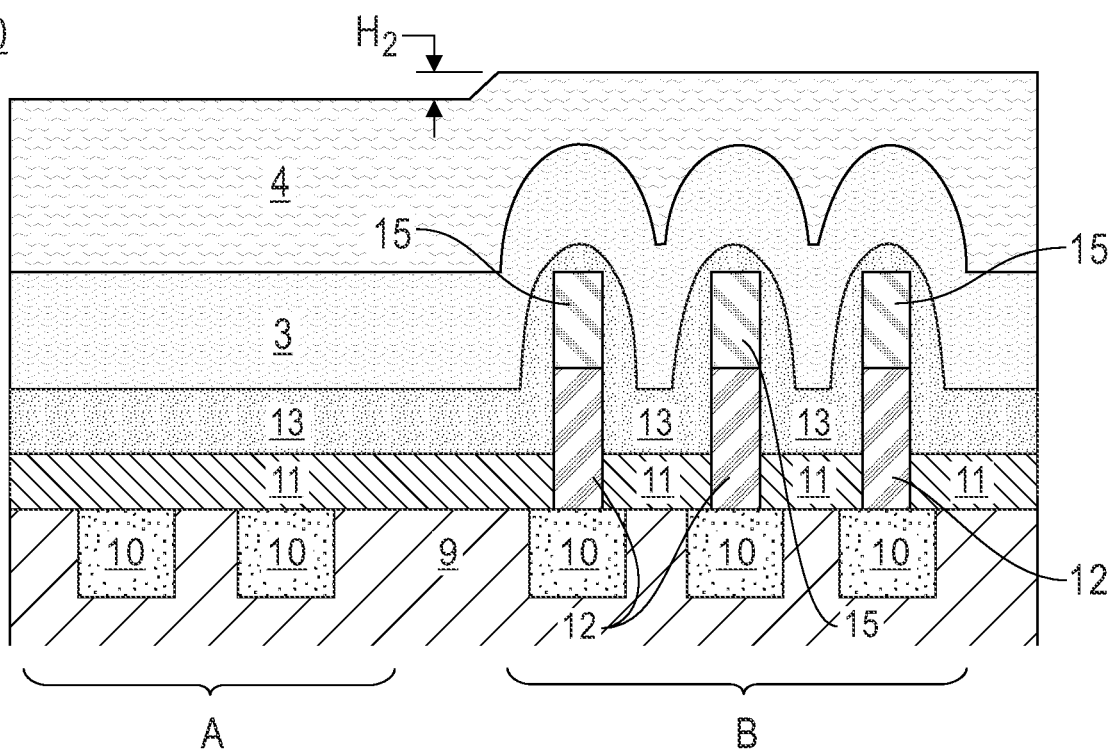
FIG. 2 is a cross-sectional view of a portion of the semiconductor structure after depositing a flowable, low-k dielectric material for a self-leveling (SP) dielectric material, in accordance with an embodiment of the present invention.

FIG. 2 is a cross-sectional view of semiconductor structure 200 after depositing a layer of self-leveling (SL) dielectric 4 over ILD 3, in accordance with an embodiment of the invention. As depicted, FIG. 2 includes the elements of FIG. 1 and self-leveling (SL) dielectric 4. In various embodiments SL dielectric 4 may be deposited using a vacuum plasma chemical vapor deposition process further utilizing organosilicon and oxygen precursors at low temperature (50-100 degrees C.), followed by a UV cure at a higher temperature (e.g., 150-450 degrees C.) to provide dielectric material hardening but embodiments of the present invention are not limited to this deposition method.

In various embodiments, SL dielectric 4 is composed of a self-leveling, flowable, low-k dielectric material. For example, SL dielectric 4 is composed of a flowable SiOCH (silicon, oxygen, carbide, hydrogen) material but SL dielectric 4 is not limited to this flowable, low-k dielectric material and may be any other flowable, low-k dielectric material suitable for forming a semiconductor device with NVM pillars 15. The flowable nature of the dielectric material provides SL dielectric 4 with the ability to planarize or self-planarize the surface of the low-k dielectric material. SL dielectric 4 provides a relatively flat and even top surface for SL dielectric 4 after deposition and cure. After depositing SL dielectric 4, a small difference exists, as depicted in FIG. 2 by H2, between the height of the top surface of SL dielectric 4 in logic region A and the top surface of SL dielectric 4 in the memory region B (e.g., H2 is typically less than one-half of NVM pillar 15 height). The deposition of SL dielectric 4 reduces the differences in the height of the top surfaces of logic region A and memory region B in semiconductor structure 200. In various embodiments, SL dielectric 4 can be deposited by the previously discussed flowable chemical vapor deposition process with typical thickness in the range of 20-500 nm but can also be deposited by other deposition processes and other thicknesses. The thickness of SL dielectric 4 can vary depending on the structure (e.g., NVM pillars 15 height) and the dimension of the pitch between the pillars in the array of NVM pillars 15 The thickness of SL dielectric 4 can be approximately the same as or greater than the height of NVM pillars 15 and ILD 3 combined but is not limited to this thickness.

Figure 3:
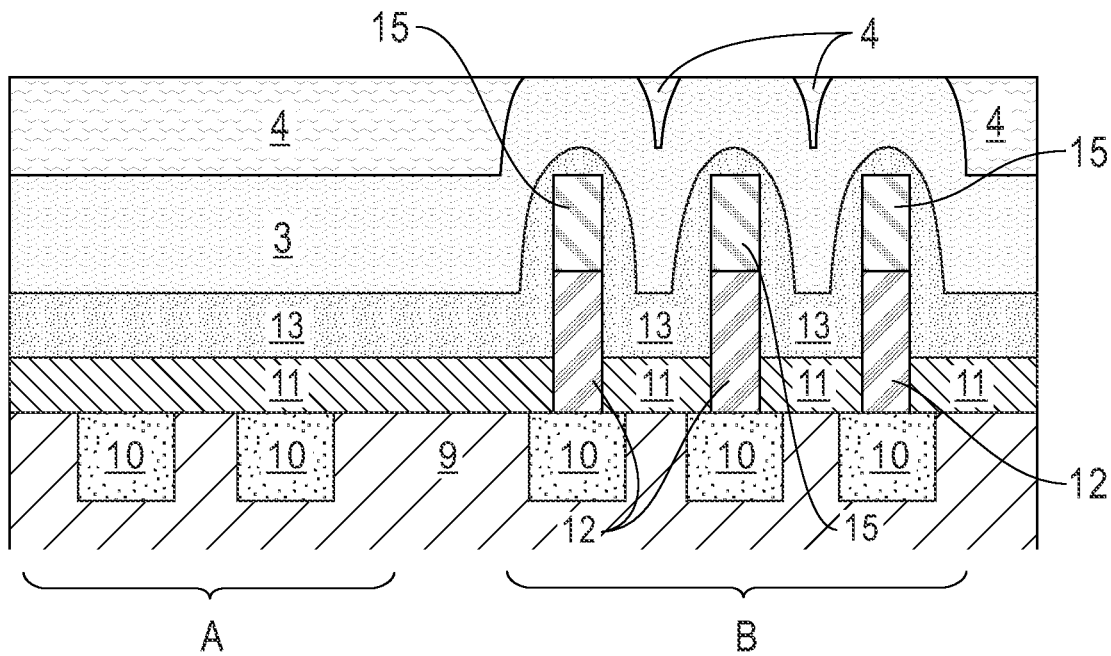
FIG. 3 is a cross-sectional view of a portion of the semiconductor structure after performing a chemical mechanical polish (CMP), in accordance with an embodiment of the present invention.

FIG. 3 is a cross-sectional view semiconductor structure 300 after performing a CMP, in accordance with an embodiment of the present invention. As depicted, FIG. 3 includes the elements of FIG. 2 but with top portions of SL dielectric 4 and portions of ILD 3 removed by the CMP. The CMP removes the top portions of SL dielectric 4 and ILD 3 to planarize or level the top surface of semiconductor structure 300. Specifically, the CMP removes the top portions of SL dielectric 4 and ILD 3 in memory region B and the top portion of SL dielectric 4 in logic region A. As depicted, after the CMP, portions of SL dielectric 4 remain in the valleys or dips in ILD 3 created between adjacent NVM pillars 15 in memory region B and portions of SL dielectric 4 remain above ILD 3 in logic region A.

After the CMP, the top surface of semiconductor structure 300 above logic region A and memory region B above NVM pillars 15 are almost level or are essentially level. After the CMP, there is little to no dip present in the top surface of SL dielectric 4 in the transitional area between logic region A and memory region B. In other words, there is minimal height differences in the top surface of semiconductor structure 300 in logic region A and memory region B. The nearly flat or level surface of semiconductor structure 300 reduces or prevents BEOL metal smearing or puddling in the transitional area (e.g., depicted by H1 in FIG. 1) in later processing steps that form lines and contacts with the Mx+1 metal.

Figure 4:
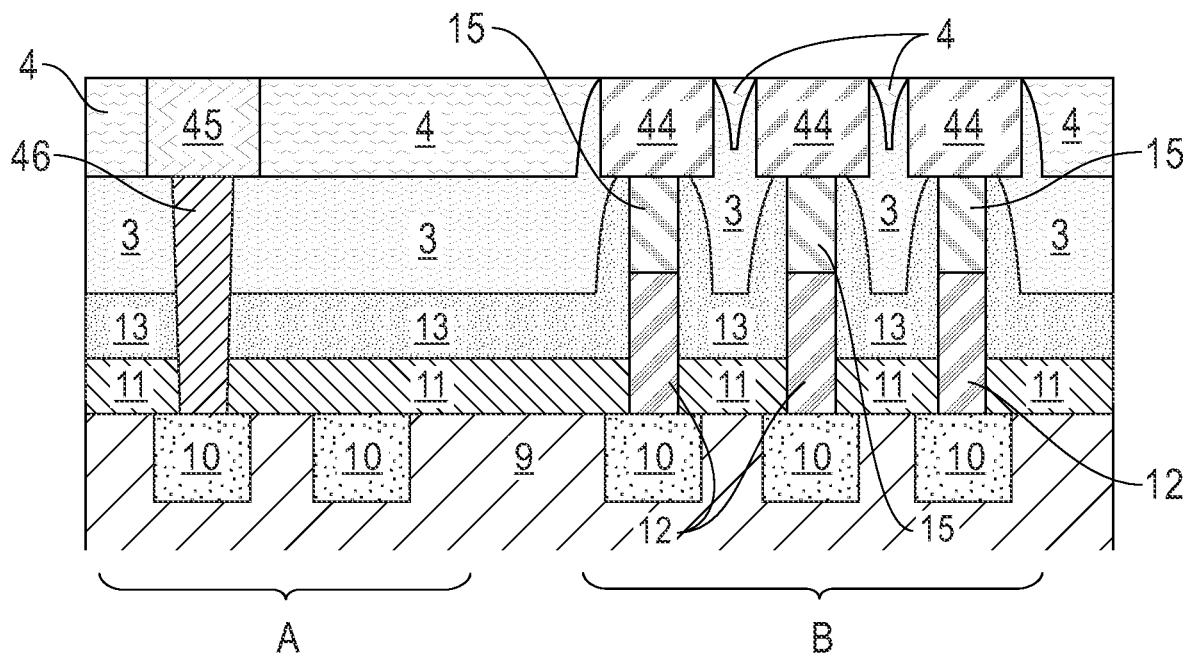
FIG. 4 is a cross-sectional view of the semiconductor structure after forming contacts to the NVM pillars, lines, and vias in the metal layer formed above the logic device region and NVM pillars, in accordance with an embodiment of the present invention.

FIG. 4 is a cross-sectional view of semiconductor structure 400 after forming contacts 44, contact 45, and via 46, in accordance with an embodiment of the present invention. Using known damascene processes, contacts 44 are formed above NVM pillars 15 in memory region B, contact 45 above via 49, and via 46 in logic region A can be formed.

In various embodiments, a selective etch (e.g., using lithography patterning and a reactive ion etch) removes portions of SL dielectric 4 and ILD 3 above at least one of Mx metal 10 in logic area A to form via holes and trenches and also removes portions of ILD 3 above NVM pillars 15. A layer of a BEOL metal material, such as copper, cobalt, tungsten, ruthenium, etc. can be deposited in the via hole to form via 46 contacting Mx metal 10 and fills the trench in logic area A above the via hole to form contact 45 after the CMP removes excess BEOL metal over SL dielectric 4 and any remaining exposed ILD 3. In some embodiments, contact 45 is a line in the Mx+1 metal layer. The BEOL metal also fills the openings or holes in ILD 3 above each of NVM pillars 15 to form contacts 44 after the CMP. As depicted, contacts 44 reside in ILD 3 and are adjacent to the remaining portions of SL dielectric 4 in memory region B. Contact 45 resides in SL dielectric 4 and via 46 extends through ILD 3, encapsulation dielectric 13, and cap 11 to contact one of Mx metal 10. In various embodiments, the sides of ILD 3 form wedge-shaped gaps between adjacent NVM pillars 15. In these embodiments, the remaining portions of SL dielectric 4 form wedge-shaped or v-shaped portions of SL dielectric 4 abutting ILD 3 where ILD 3 abuts and is between each of contacts 44 in memory region B.

As previously discussed, and as depicted in FIG. 4, BEOL metal puddling of the Mx+1 metal layer forming contacts 44 and 45 does not occur over SL dielectric 4 in the top surface of semiconductor structure 400. SL dielectric 4 provides a relatively flat surface before forming contacts 44 and contact 45. As depicted, the transitional area between logic region A and memory region B (e.g., depicted by H1 in FIG. 1) has a clean dielectric surface above SL dielectric 4 (e.g., no smeared BEOL metal above SL dielectric 4 in the vicinity of contacts 44 and contact 45, and therefore, no shorts are created in the Mx+1 metal layer from contacts 44 and contact 45 formation).

Figure 5:
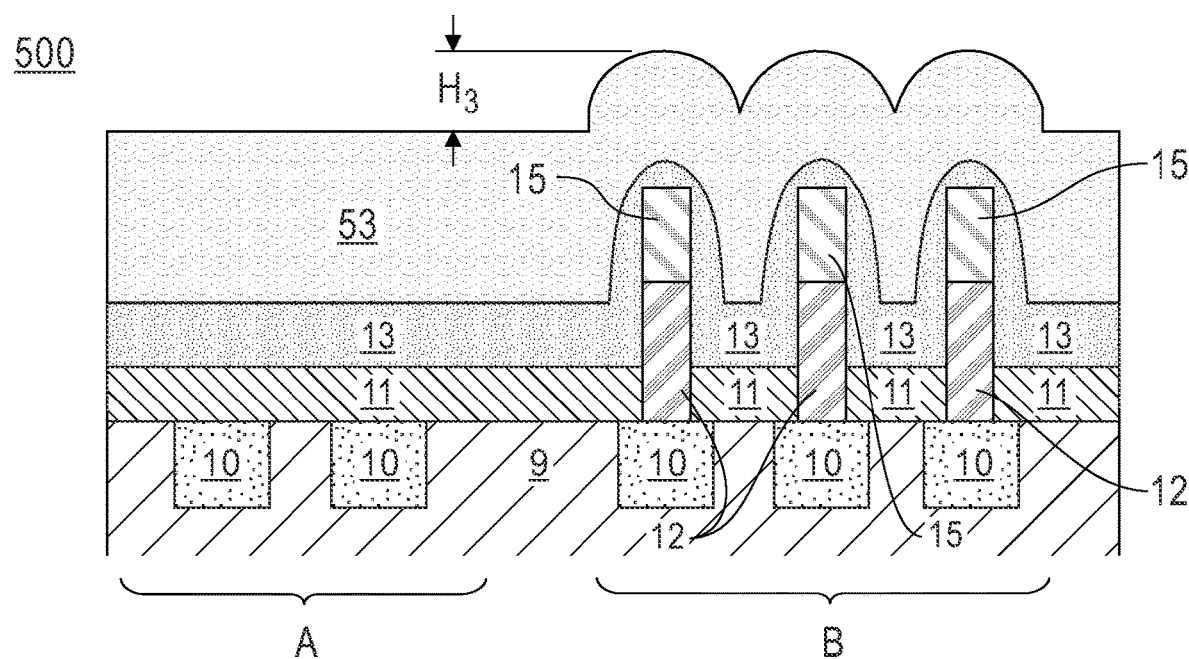
FIG. 5 is a cross-sectional view of a semiconductor structure after depositing an interlayer dielectric (ILD) material layer over the encapsulation dielectric, in accordance with a second embodiment of the present invention.

FIG. 5 is a cross-sectional view of semiconductor structure 500 after depositing ILD 53 over encapsulation dielectric 13, in accordance with an embodiment of the present invention. As depicted, FIG. 5 includes logic region A, memory region B, Mx metal 10, ILD 9, cap 11, encapsulation dielectric 13, bottom contact 12, NVM pillars 15, and ILD 53. Mx metal 10, ILD 9, encapsulation dielectric 13, bottom contact 12, and NVM pillars 15 are essentially the same as the elements discusses with respect to FIG. 1. H3 depicts the height difference between the top surface of ILD 53 over NVM pillars 15 in memory region B and the top surface of ILD 53 over logic region A. H3 can be approximately the same height as H1 depicted in FIG. 1 (e.g., within 15 to 25% of H1). ILD 53 can be composed of the same or similar dielectric material as ILD 3 however, the thickness of ILD 53 is slightly greater than the thickness of ILD 3. For example, the thickness of ILD 53 can be greater than 70% to 170% the height of NVM pillars 15.

Figure 6:
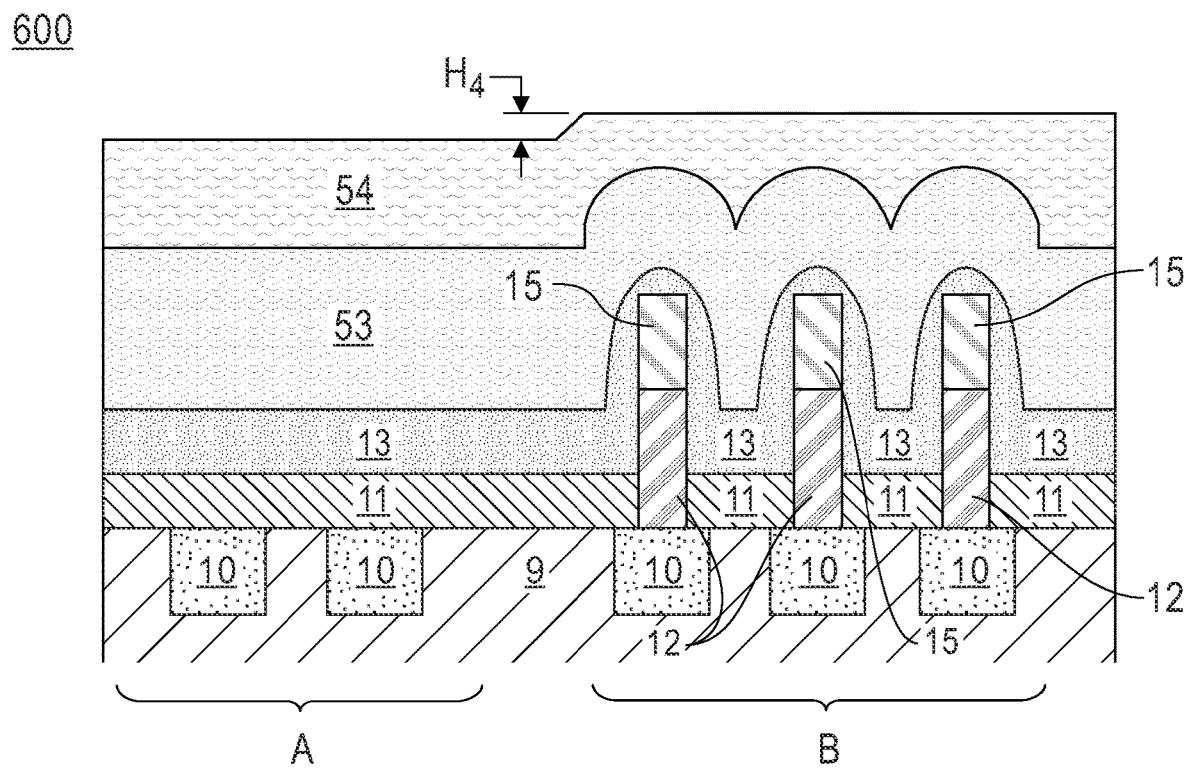
FIG. 6 is a cross-sectional view of the semiconductor structure after depositing a sacrificial self-leveling dielectric material over the ILD material, in accordance with the second embodiment of the present invention.

FIG. 6 is a cross-sectional view of semiconductor structure 600 after depositing SL dielectric 54 over ILD 53, in accordance with an embodiment of the present invention. As depicted, FIG. 6 includes the elements of FIG. 5 and SL dielectric 54. SL dielectric 54 is essentially the same as SL dielectric 4. SL dielectric 54 may be deposited with the same or similar processes as SL dielectric 4 is deposited with a thickness that covers and extends above the top surface of ILD 53 in memory region B. H4 depicts a difference in the height of the top surface of SL dielectric 54 in memory region B above NVM pillars 15 and the top surface of SL dielectric 54 in logic region A. H4 can be approximately the same as H2 or greater than H2 depicted in FIG. 2. As depicted, H4 represents a slight dip or change in the height of the top surface of SL dielectric 54 occurring in the transition area between logic region A and memory region B.

Figure 7:
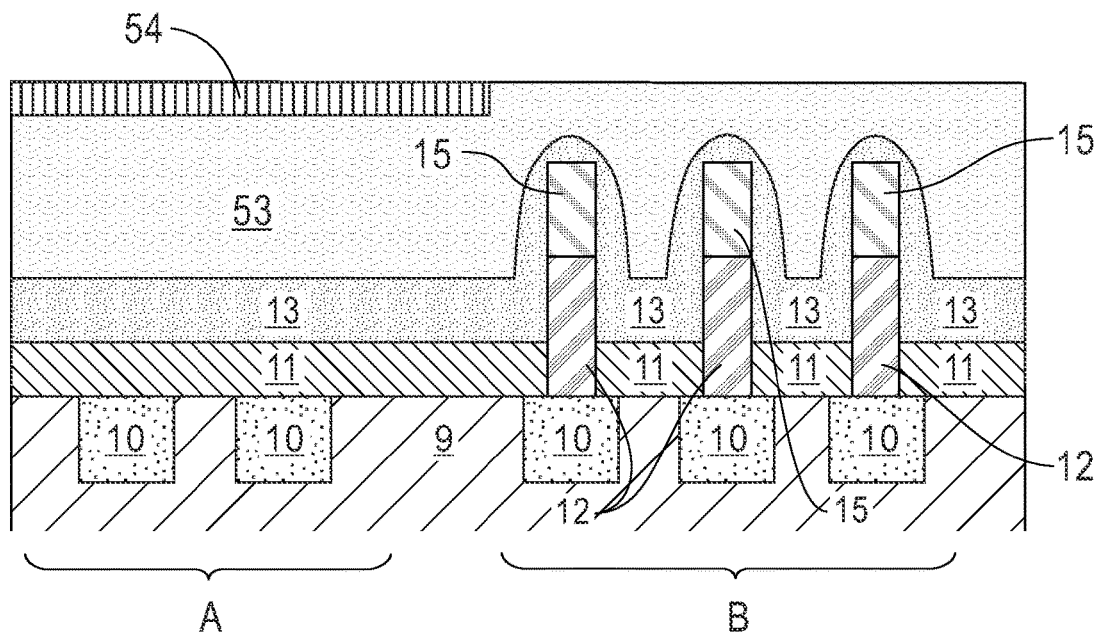
FIG. 7 is a cross-sectional view of the semiconductor structure after performing a chemical mechanical polish (CMP), in accordance with the second embodiment of the present invention.

FIG. 7 is a cross-sectional view of semiconductor structure 700 after performing a CMP, in accordance with an embodiment of the present invention. As depicted, FIG. 7 includes the elements of FIG. 6 without a portion of SL dielectric 54. The CMP levels the top surface of semiconductor structure 600 and removes the top portion of SL dielectric material 54 in logic region A, SL dielectric 54 in memory region B and a top portion of ILD 53 in memory region B over NVM pillars 15. As depicted, the top surface of semiconductor structure 700 is flat and is composed of SL dielectric 54 in logic region A and ILD 53 in memory region B.

After the CMP, the amount of ILD 53 removed by the CMP in memory region B leaves the remaining layer of ILD 53 with a thickness that is sufficient to form contacts (not depicted in FIG. 7) connecting to NVM pillars 15 in later processes. As depicted in FIG. 7, after the CMP, the top surface of ILD 53 in memory region B is essentially flat and level. The top surface of semiconductor structure 700 (e.g., ILD 53 and the top surface of SL dielectric 54) is flat and level across logic region A, memory region B, and in the transition area between logic region A and memory region B. In some embodiments, SL dielectric 54 (not depicted in FIG. 7) is removed in logic region A.

Figure 8:
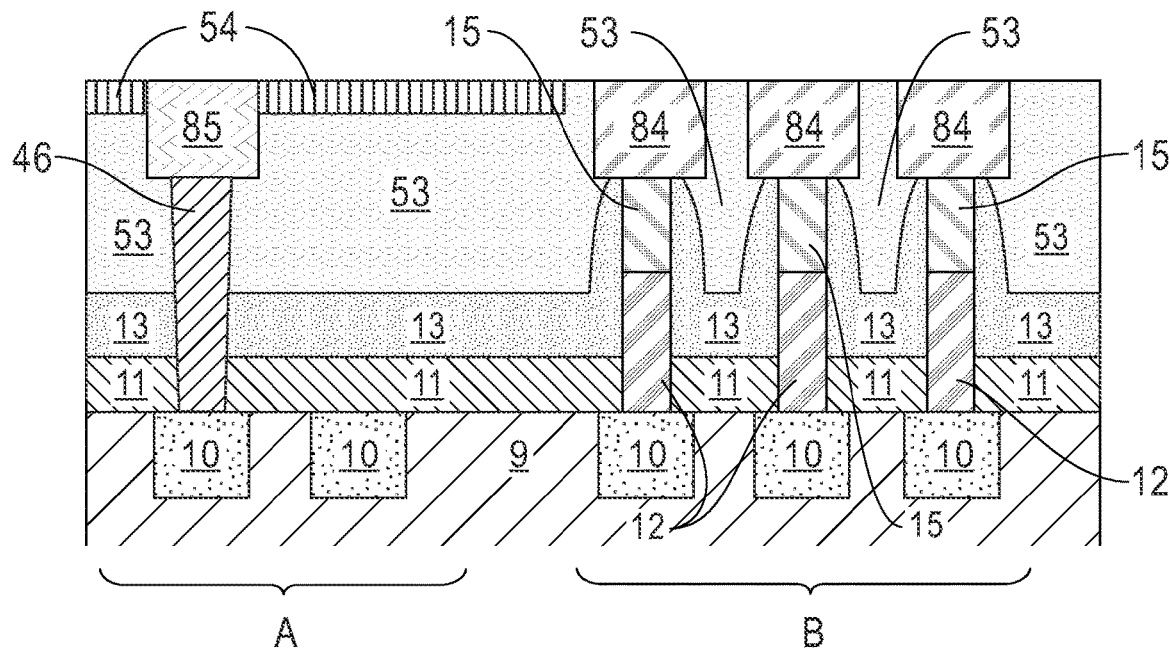
FIG. 8 is a cross-sectional view of the semiconductor structure after forming contacts to the NVM pillars, lines, and vias in a metal layer deposited over the logic region and the NVM pillars, in accordance with the second embodiment of the present invention.

FIG. 8 is a cross-sectional view of semiconductor structure 800 after forming contacts 84, contact 85, and via 46, in accordance with an embodiment of the present invention. As depicted, FIG. 8 includes contacts 84, contact 85, via 46, ILD 53, encapsulation dielectric 13, NVM pillars 15, bottom contact 12, cap 11, Mx metal 10, and ILD 9.

Using known damascene processes, trenches or openings for contacts 84 and contact 85 and a via hole for via 46 are patterned on ILD 53 and SL dielectric 54 and etched. A BEOL metal (e.g., copper, tungsten, ruthenium, cobalt, etc.) is deposited as the Mx+1 metal layer over ILD 53 in memory region B and SL dielectric 54 in logic region A. For example, the Mx_1 metal is deposited over exposed surfaces of NVM pillars 15 in the trenches in memory region B, in the via hole and above the exposed surface of Mx metal 10, and trenches in logic region A to form contacts 84 and contact 85 that is over via 46. In some embodiments, contact 85 is a circuit line in the Mx+1 metal layer. A CMP is performed to remove excess BEOL metal from the top surface of ILD 53 and SL dielectric 54. After performing the CMP, the top surface of semiconductor structure 800 is flat and no residual or smeared BEOL metal remains over ILD 53, over SL dielectric 54, or on the top surface of semiconductor structure 700 in the transitional region between logic region A and memory region B.

The ability of SL dielectric 54 deposited in FIG. 6 to flow and self-level to provide a relatively flat surface, with only a slight variation in the top surface of SL dielectric 54 in the transitional area between logic region A and memory region B, allows the creation of a relatively or essentially flat surface in semiconductor structure 700 after the CMP removes portions of SL dielectric 54 and ILD 53. As a result of creating a relatively flat surface of semiconductor structure 700, the smearing of the BEOL metal does not occur during the CMP when the CMP removes the overburden or excess BEOL metal (e.g., the excess Mx+1 metal layer). As depicted, using SL dielectric 54 deposited over ILD 53 before forming BEOL metal does not leave portions of the BEOL metal on the top surfaces of ILD 53, SP dielectric 54, or in the transitional area between logic region A and memory region B. The flat or level dielectric surfaces of semiconductor structure 700 prevents or reduces shorting due to puddling or smear of Mx+1 metal during contacts 84, contact 85, and via 46 formation. As known to one skilled in the art, in various embodiments, the BEOL processes continue, and additional BEOL interconnect layers and semiconductor device contacts may be formed to complete the semiconductor device.

Figure 9:
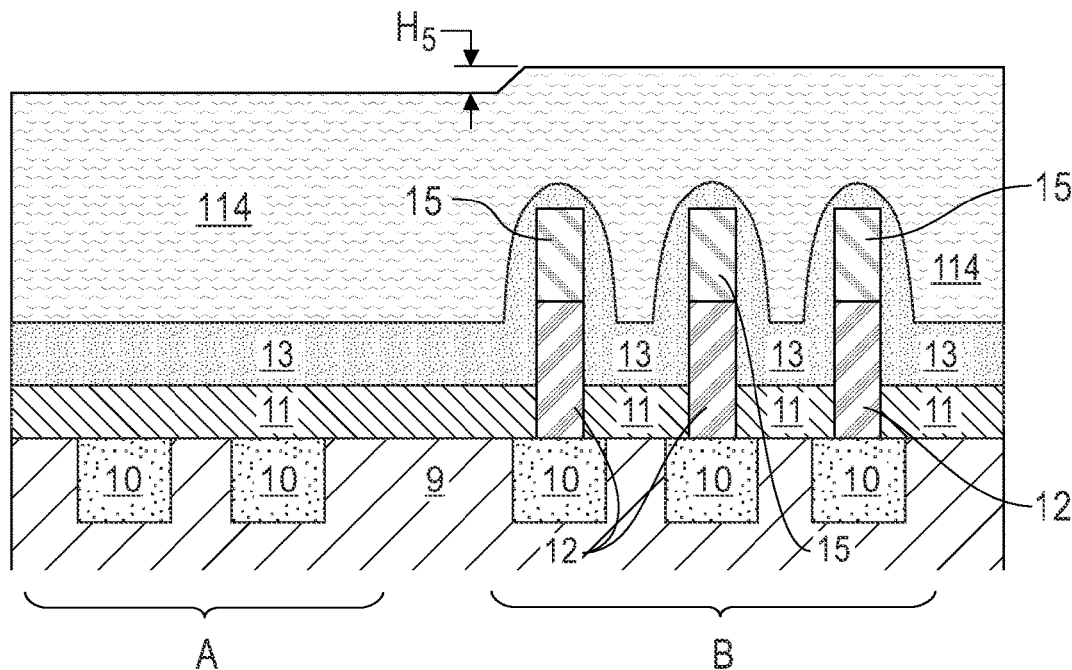
FIG. 9 is a cross-sectional view of a semiconductor structure after depositing a layer of the self-leveling dielectric over the encapsulation dielectric material, in accordance with a third embodiment of the present invention.

FIG. 9 is a cross-sectional view of semiconductor structure 900 after depositing SL dielectric 114 over encapsulation dielectric 13, in accordance with an embodiment of the present invention. As depicted, FIG. 9 includes logic region A, memory region B, SL dielectric 114, encapsulation dielectric 13, NVM pillars 15, bottom contact 12, cap 11, Mx metal 10, and ILD 9. Encapsulation dielectric 13, NVM pillars 15, bottom contact 12, cap 11, Mx metal 10, and ILD 9 are essentially the same as the elements discussed in detail with reference to FIG. 1. FIG. 9 does not include ILD 3 and instead includes a thick layer of SL dielectric 114. SL dielectric 114 can be composed of the same material as SL dielectric 4 and can be deposited using the same or similar deposition processes as used for SL dielectric 4 discussed previously with reference to FIG. 2. SL dielectric 114 covers encapsulation dielectric 13 and extends above the top of encapsulation dielectric 13 which is over NVM pillars 15 in memory region B.

In this embodiment, SL dielectric 114 is deposited over encapsulation dielectric 13 and flows over the surface of encapsulation dielectric 13. A small dip or change in the top surface height of SL dielectric 114, labeled H5, occurs in the transitional region between logic region A and memory region B. The height difference in the top surface of SL dielectric 114 above NVM pillars 15 and the top surface of SL dielectric 114 over logic region A can be less than one-half the pillar height of NVM pillars 15. The height of NVM pillars 15 can be 25 to 300 nm but is not limited to these heights.

Figure 10:
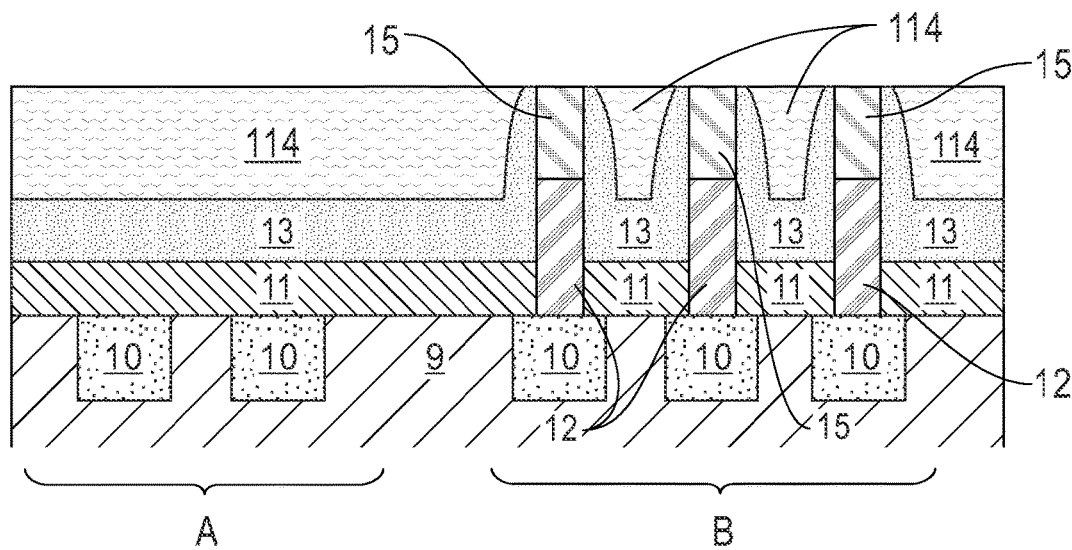
FIG. 10 is a cross-sectional view of the semiconductor structure after performing a CMP, in accordance with the third embodiment of the present invention.

FIG. 10 is a cross-sectional view of semiconductor structure 1000 after performing a CMP, in accordance with an embodiment of the present invention. As depicted, FIG. 10 includes the elements of FIG. 9 but with a top portion of SL dielectric 114 over logic region A and memory region B removed by the CMP along with the top portions of encapsulation dielectric 13 over NVM pillars 15 in memory region B. After the CMP, the top surface of semiconductor structure 1000 is essentially level or flat.

As depicted, the bottom portion of SL dielectric 114 remains over encapsulation dielectric 13 in logic region A and between the remaining portions of encapsulation dielectric 13 around NVM pillars 15 in memory region B. In various embodiments, SL dielectric 114 is 1 is encapsulation dielectric 13 and fills each the gaps between NVM pillars 15. In some examples, SL dielectric 114 fills a small gap between bottom contacts 12. In various embodiments, the CMP stop is the hardmask (not depicted in FIG. 10) that is in the top surface of NVM pillars 15. In these embodiments, SL dielectric 114 is removed from the top surface of NVM pillars 15.

In some embodiments, the CMP stop is the top surface of encapsulation dielectric 13 over NVM pillars 15 (not depicted). In one embodiment, a portion of encapsulation dielectric 13 is exposed in the top surface of semiconductor structure 1100 between NVM pillars 15 and SL dielectric 114. In this case, the top surface of SL dielectric 114 is level with the highest portion of encapsulation dielectric 13 above NVM pillars 15. In in later steps discussed with respect to FIG. 12, to form the contacts above NVM pillars 15, in the BEOL damascene process, the etch process of the Mx+1 metal layer would include etching both of ILD 120 (see FIGS. 11 and 12) and the remaining portion of encapsulation dielectric 13 above NVM pillars 15.

Figure 11:
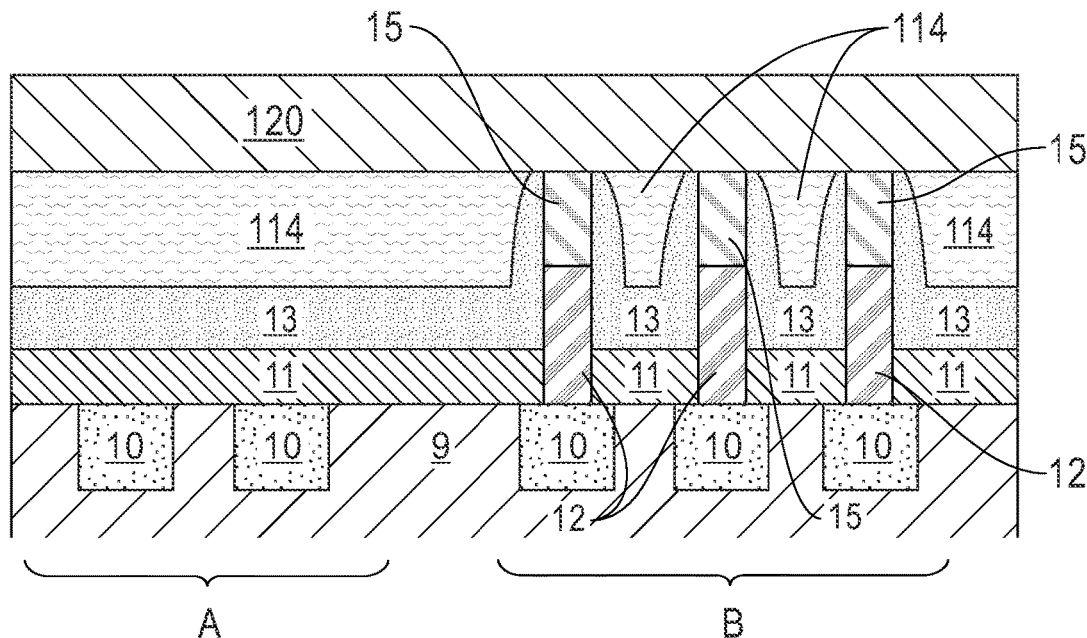
FIG. 11 is a cross-sectional view of the semiconductor structure after depositing a layer of ILD material over exposed surfaces of the self-leveling dielectric material and the top surface of the NVM pillars, in accordance with an embodiment of the present invention.

FIG. 11 is a cross-sectional view of semiconductor structure 1100 after depositing ILD 120 over the exposed surfaces of SL dielectric 114 and NVM pillars 15, in accordance with an embodiment of the present invention. As depicted, FIG. 11 includes the elements of FIG. 10 and ILD 120. The top surface of ILD 120, as deposited over the flat surface of SL dielectric 114, is also flat due the flat surface of SL dielectric 114 as deposited and the flat top surface of semiconductor structure 1100 as depicted in FIG. 11 after the CMP.

ILD 120 can be deposited with known deposition methods for interlayer dielectric materials (e.g., CVD, PVD, etc.). In various embodiments, ILD 120 is composed of a low-k dielectric material or a low-k dielectric material with another dielectric material (e.g., SiCNO, SiCN, porous SiCN, SiCOH, porous SiCOH, AlOx under one of porous SiCN or porous SiCOH). ILD 120 is deposited with a thickness greater than the height of the contacts of the Mx+1 metal layer (e.g., the next metal layer deposited for contact formation as discussed later with respect to FIG. 12) in the BEOL interconnect structure. For example, the thickness of ILD 120 can range from 20 nm to 500 nm when Mx metal 10 is an M1 metal layer.

Figure 12:
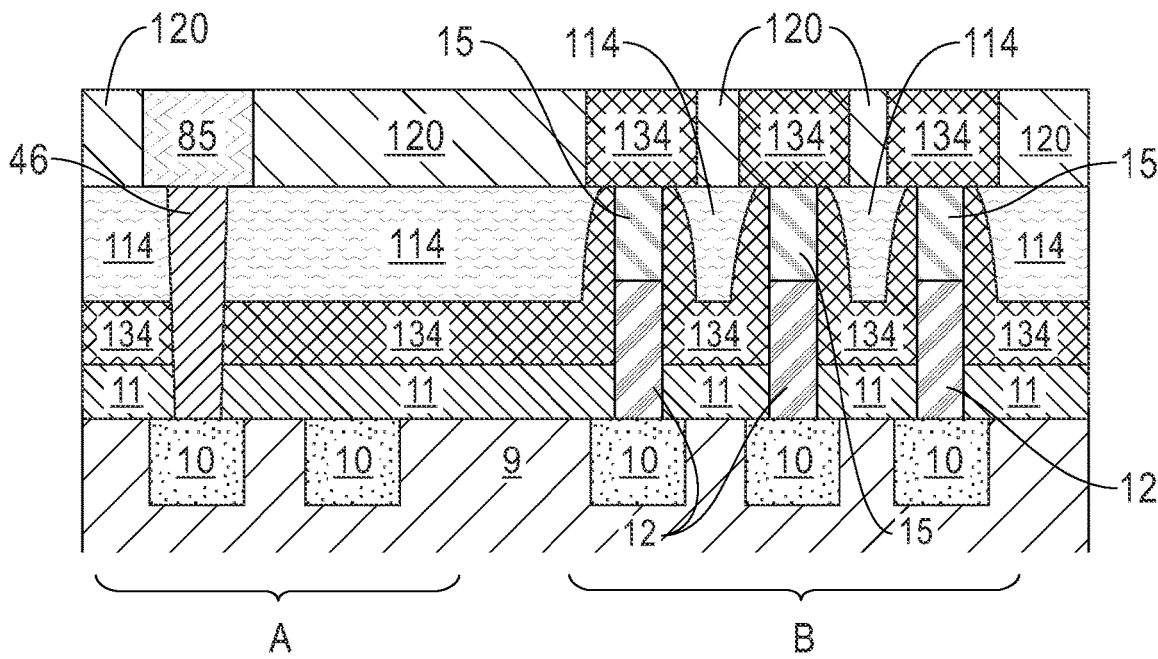
FIG. 12 is a cross-sectional view of the semiconductor structure after forming contacts to the NVM pillars, lines, and vias in a deposited metal layer, in accordance with the third embodiment of the present invention.

FIG. 12 is a cross-sectional view of semiconductor structure 1200 after forming contacts 134, contact 85, and via 46, in accordance with an embodiment of the present invention. As depicted, FIG. 12 includes contacts 134, contact 85, via 46, ILD 120, SL dielectric 114, NVM pillars 15, bottom contact 12, encapsulation dielectric 13, cap 11, Mx metal 10, and ILD 9. Contacts 134 are formed above and connecting to NVM pillars 15.

Using conventional BEOL processes (e.g., damascene processes), as depicted in semiconductor structure 1200, contact 85 in ILD 120 (e.g., an Mx+1 metal layer ILD), via 46 under contact 85, and contacts 134 connecting to NVM pillars 15 are formed. In some embodiments, contact 85 is a line in the Mx+1 metal layer. After patterning and etching ILD 120 to form trenches for the contacts and forming a via hole for via 46, a BEOL metal layer is deposited and a CMP process removes excess BEOL metal from the top surface of ILD 120 to form contacts 134, contact 85, and via 46 followed by CMP removing the excess BEOL metal from the top surface of ILD 120 and in some cases, removing a top portion of ILD 120. As depicted, contacts 134 and contact 85 can be formed in ILD 120 where contacts 134 reside on and connect to NVM pillars 15. Portions of SL dielectric 114 remain between NVM pillars 15 around encapsulation dielectric 13 in memory region B. The top portion of via 46 resides in the remaining SL dielectric 114, in encapsulation dielectric 13, and cap 11 contacting Mx metal 10 in logic region A.

As depicted in FIG. 12, the top surface of ILD 120 and SL dielectric 114 is relatively flat and no dips or drops in the top surface of either ILD 120 or SL dielectric 114 occur in the transitional area between logic region A and memory region B. Due to the flat surface of ILD 120, after the CMP removes the overburden or excess BEOL metal above ILD 120, the transitional area between logic area A and memory area B is free of BEOL metal. With an essentially flat surface of ILD 120, no smeared BEOL metal and no puddling of the BEOL metal occurs over ILD 120. In this way, depositing SL dielectric 114 followed by a CMP and ILD 120 deposition to create a flat surface prior to forming contacts connecting to NVM pillars 15 and contacts and vias for logic devices in logic region A prevents shorting due to residual BEOL metal after forming contacts 134 in semiconductor structure 1200. Contacts 134 are formed without an occurrence of BEOL puddling and without the use of additional mask levels. Additionally, an Mx+1 ILD surface height for ILD 120 is achieved that provides contacts 134 with the typical contact height in the Mx+1 metal layer contact using convention BEOL processes.

Figure 13:
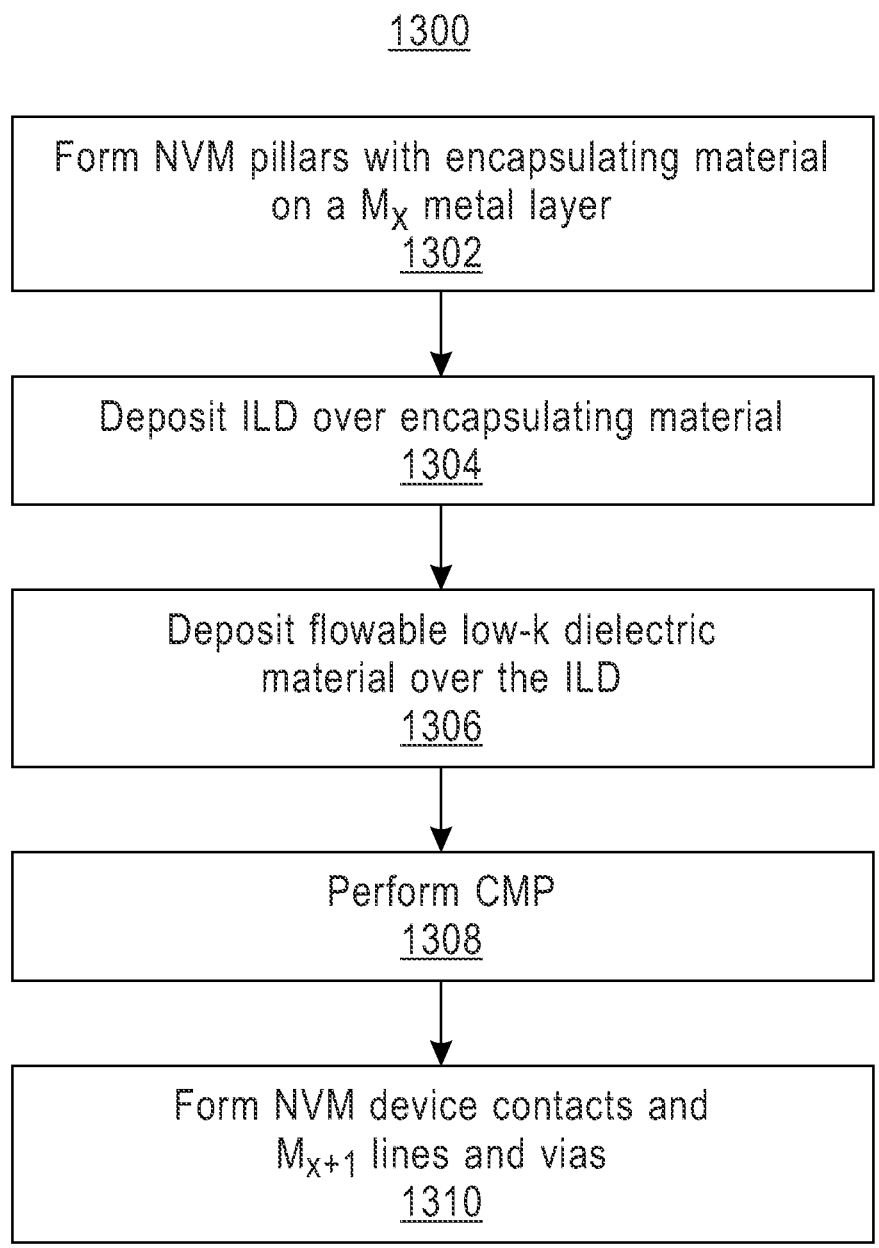
FIG. 13 is an example of a method to use a maskless interlayer dielectric removal process and a self-leveling dielectric to form embedded, pillar-based NVM memory devices, in accordance with embodiments of the present invention.

FIG. 13 is an example of a method to use a maskless interlayer dielectric removal process and a self-leveling dielectric to form embedded pillar based NVM memory devices, in accordance with embodiments of the present invention. In various embodiments, the method is performed on one or more arrays of pillars for non-volatile memory devices on portions a BEOL metal layer in a semiconductor structure. The method ultimately provides a level top surface of a dielectric layer directly above the array of pillars and in other adjacent logic device regions of the semiconductor structure (e.g., containing logic devices, macros, and/or other non-pillar-based semiconductor devices and circuits).

In step 1302, the method includes forming non-volatile memory pillars on portions of a BEOL layer with portions of a Mx metal that is covered with an encapsulating dielectric material that is over a cap material. Using known memory device formation processes, each pillar in an array of pillars is formed on a bottom contact connecting to a portion of the BEOL metal layer (e.g., Mx metal 10 depicted in FIG. 1). The pillars can be formed with any set of materials suitable for creating pillars for one of MRAM devices, PCM devices, RRAM devices, or other pillar-based non-volatile memory device forming an array of more than one vertical pillar structure. For example, the pillars may include one or more MTJs in a phase change memory cell. The pillars in the array of pillar-based memory structures are adjacent to an area with logic devices, macros, or other non-pillar-based circuits above the semiconductor substrate.

In step 1304, the method includes depositing an ILD layer over the encapsulating dielectric material. The ILD material deposited by CVD, PVD, or ALD covers encapsulating dielectric material that is over the array of pillars and the logic devices. The method includes forming a top surface of the ILD that is higher, extending above the array of pillars, and lower in the logic device region adjacent to the array of pillars. The top surface of the ILD can have bumps or raised regions above each pillar in the array of pillars and a flatter surface in the logic device region. In various embodiments, the ILD material is a low-k dielectric material.

In various embodiments, the thickness of the deposited ILD material over the encapsulation material can range from 50% to 150% of the height of the pillars in the array of pillars. In other embodiments, a thicker deposition of the ILD material occurs resulting in an ILD thickness that is greater than 150% of the pillar height. In one embodiment, the ILD material is not deposited over the encapsulating dielectric material but instead, a layer of a flowable, self-leveling dielectric material with a low-k dielectric constant is deposited by CVD.

In step 1306, the method includes depositing the self-leveling, flowable, low-k dielectric material. For example, the self-leveling, low k dielectric material may be deposited using a vacuum plasma chemical vapor deposition process using organosilicon and oxygen precursors at low temperature for self-leveling or flowability of the dielectric material prior to heating the self-leveling, low-k dielectric for a UV cure at a higher temperature (e.g., 150-450 degrees C.) for material hardening but is not limited to this deposition method. In another example, the self-leveling dielectric is a spin-on-dielectric.

Using a self-leveling, low-k dielectric material with a composition providing the low-k dielectric material to flow and self-level the surface of the low-k dielectric material producing a flat or level dielectric surface. The self-leveling, low-k dielectric material reduces the height variation of the top surface of the semiconductor structure before forming contacts for each of the pillars in the array of pillars-based memory structures used to create the non-volatile memory devices and reduces or avoids the occurrence of smearing or puddling that result from uneven surfaces during subsequent BEOL metallization layer processing.

The regions of the semiconductor structure with logic devices with lower device profiles and regions of the semiconductor structure with the arrays of pillars with higher device profiles are evened out using the self-leveling, flowable, low-k dielectric material to create a level dielectric surface of the semiconductor structure prior to contact formation for the pillar-based memory structures.

The self-leveling, low-k dielectric material can be a material or a compound including SiOCH or another similar self-leveling, low-k dielectric material. In various embodiments, the deposited self-leveling, low-k dielectric material completely covers the ILD material and extends above the ILD material. In one embodiment, no ILD material is present and the self-leveling, low-k dielectric material is deposited directly on the encapsulation material over the array of pillars and above the logic device region that is adjacent to the array of pillars. In some cases, a slight variation in the top surface of the self-leveling, low-k dielectric material occurs. The height variation or dip in the transition area between the logic devices and the array of pillars can be less than one-half of the height of a pillar in the array of pillars. In these cases, the surface of the self-leveling, low-k dielectric material is lower above the logic device region adjacent to the array of pillars than the surface of the self-leveling, low-k dielectric material above the array of pillars.

In step 1308, a CMP is performed. In various embodiments, the CMP removes a top portion of the self-leveling, low-k dielectric material and leaves a bottom portion of the self-leveling, low-k dielectric material above the logic devices and the bottom portions of the self-leveling, low-k dielectric between adjacent pillar in the array of pillars. The top portions of the ILD material above the pillars in the array of pillars can be removed by the CMP. In these embodiments, portions of the self-leveling, low-k dielectric and some portions of the ILD above the pillars are exposed in the top surface of the semiconductor structure after the CMP. The top surface of the semiconductor structure that is composed of one or more dielectric materials in various embodiments is flat after performing the CMP.

In other embodiments, when a thicker layer of the ILD material is deposited on the encapsulation material, after the CMP, none of the self-leveling, low-k dielectric material remains. In these embodiments, either the hardmask in the array of pillars or the top surface of the encapsulation material over the array of pillars may be used as a CMP stop.

In one embodiment, the ILD material is not present, and the CMP removes the top portion of the self-leveling, low-k dielectric material, leaving the bottom portion of the self-leveling, low-k dielectric material above the encapsulating dielectric material above both the array of pillars and the adjacent logic device region. Either the hardmask in the pillars of the array of pillars or the top surface of the encapsulation material over the array of pillars may be used as a CMP stop.

In step 1310, the method includes using known BEOL processes to form non-volatile memory device contacts and (circuit?) lines in the Mx+1 metal layer. In some embodiments, the method uses known damascene processes to form the non-volatile memory device contacts above and connections to each pillar in the array of pillars in the non-volatile memory devices. The damascene processes are also used to form contacts and/or Mx+1 metal lines and the vias connecting the logic devices and the Mx metal layer to the lines or contacts in the Mx+1 metal layer. In various embodiments using a thinner ILD, after the contacts to the array of pillars are formed, small portions of the self-leveling, low-k dielectric material remain above the encapsulation material between each contact to a pillar in the array of pillars and above the logic device region. No BEOL metal is smeared in the region adjacent to the array of pillars and the surface of the resulting semiconductor structure.

In other embodiments, when a thicker layer of the ILD material is deposited on the encapsulating dielectric material, none of the self-leveling, low-k dielectric material remains after the CMP. In these cases, the contacts, vias, and/or the Mx+1 metal lines are formed in the ILD material above the encapsulation material as depicted in FIG. 8.

In one embodiment, without the ILD material deposition on the encapsulating dielectric material, only the self-leveling, low-k dielectric material covers the array of pillars. After performing the CMP on of the self-leveling, low-k dielectric material in step 1308, another layer of an ILD material (e.g., the Mx+1 ILD layer) is deposited over the self-leveling, low-k dielectric material and the contacts to the pillars and logic devices, the vias, and/or the Mx+1 metal lines are formed in the Mx+1 ILD layer as depicted in FIG. 12.

The methods described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections and buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor structure, the semiconductor structure comprising:
    a flat dielectric surface of a first dielectric material between a plurality of contacts in a back end of line metal layer of a semiconductor structure, wherein a first portion of the plurality of contacts each connect to a pillar-based memory device in an array of pillar-based memory devices, a second portion of the plurality of contacts each connect to a contact in a logic region of the semiconductor structure, and the flat dielectric surface is at a same level in the logic region and around the pillar-based memory devices; and
    a second dielectric material in a continuous layer under the first dielectric material, the first portion of the plurality of contacts, and the second portion of the plurality of contacts, and surrounds sidewalls of the first portion of the plurality of contacts in a memory region of the semiconductor structure, and wherein the first dielectric material surrounds sidewalls of the second portion of the plurality of contacts.

2. The semiconductor structure of claim 1, further comprising:
    one or more portions of a first metal layer in a third dielectric material, wherein the one or more portions of the first metal layer reside in the logic region and in the memory region of the semiconductor structure;
    an encapsulation dielectric material surrounding each pillar-based memory device of the array of memory pillar-based memory devices in the memory region that is above the one or more portions of the first metal layer and the third dielectric material;
    wherein the second dielectric material is over the encapsulation dielectric material; and
    wherein the first dielectric material is over the second dielectric material, wherein the second dielectric material forms wedge-shaped portions between adjacent contacts of the first portion of the plurality of contacts in the memory region.

3. The semiconductor structure of claim 1, wherein the first dielectric material is a self-leveling dielectric material.

4. The semiconductor structure of claim 1, wherein the array of pillar-based memory devices is composed of one or more pillar-based non-volatile memory devices.

5. The semiconductor structure of claim 1, wherein the array of pillar-based memory devices is one of an array of magnetoresistive random-access memory devices, an array of resistive random-access memory devices, or an array of phase change random-access memory devices.

6. The semiconductor structure of claim 2, wherein the one or more portions of a first metal layer in the third dielectric material, further comprises:
    a dielectric cap material over the one or more portions of the first metal layer and the third dielectric material;
    a first portion of the one or more portions of the first metal layer in the third dielectric material is under each pillar-based memory device in the array of pillar-based memory devices; and
    a second portion of the one or more portions of the first metal layer is above one or more logic devices in the logic region of the semiconductor structure, wherein the second portion of the one or more portions of the first metal layer is adjacent to the first portion of the one or more portions of the first metal layer.

7. The semiconductor structure of claim 6, further comprises:
    a second portion of the plurality of contacts in the back end of line metal layer in the logic region of the semiconductor structure, wherein each contact of the second portion of the plurality of contacts in the logic region are in the first dielectric material; and
    one or more vias in the second dielectric material connect at least one contact of the second portion of the plurality of contacts in the back end of the line metal layer to at least one portion of the one or more portions of the first metal layer in the logic region.

8. A semiconductor structure, the semiconductor structure comprising:
    one or more portions of a first metal layer in a first dielectric material, wherein each of the one or more portions of the first metal layer reside in one of a logic region or a memory region of a semiconductor structure;
    an encapsulation dielectric material that surrounds each pillar-based memory device of an array of memory pillar-based memory devices in the memory region, wherein the encapsulation dielectric material is above the one or more portions of a first metal layer and the first dielectric material;
    a second dielectric material over the encapsulation dielectric material and between adjacent contacts to each pillar-based memory device in the array of memory devices; and
    a third dielectric material over only a portion of the second dielectric material that surrounds a top portion of one or more contacts in the logic region, wherein a top surface of the second dielectric material and a top surface of the third dielectric material are flat and at a same level that is between the first metal layer and a second metal layer above the first metal layer.

9. The semiconductor structure of claim 8, wherein the third dielectric material is a self-leveling, low-k dielectric material.

10. The semiconductor structure of claim 8, wherein the array of pillar-based memory devices is composed of one or more pillar-based non-volatile memory devices.

11. The semiconductor structure of claim 8, wherein the array of the pillar-based memory devices is in a selection from the group consisting of an array of magnetoresistive random-access memory devices, an array of resistive random-access memory devices, and an array of phase change random-access memory devices.

12. The semiconductor structure of claim 8, wherein the one or more portions of a first metal layer in the first dielectric material, further comprises:
   a dielectric cap material over the one or more portions of the first metal layer and the first dielectric material;
   a first portion of the one or more portions of the first metal layer in the first dielectric material is under each pillar-based memory device in the array of pillar-based memory devices in the memory region; and
   a second portion of the one or more portions of the first metal layer is above one or more logic devices in the logic region, wherein the second portion of the one or more portions of the first metal layer is adjacent to the first portion of the one or more portions of the first metal layer.

13. The semiconductor structure of claim 8, further comprises:
   one or more portions of a second metal layer are in one of the second dielectric material or in the third dielectric material and the second dielectric material, wherein a top surface of the one or more portions of the second metal layer, the top surface of the second dielectric material, and the top surface of the third dielectric material are level;
   one or more contacts composed of a first portion of the one or more portions of the second metal layer are in the third dielectric material and the second dielectric material in the logic region of the semiconductor structure;
   one or more vias connecting at least one of the one or more contacts to at least one portion of the one or more portions of the first metal layer in the logic region; and
   the adjacent contacts to each pillar-based memory device in the array of memory devices in the memory region compose a second portion of the one or more portions of the second metal layer.

14. A semiconductor structure, the semiconductor structure comprising:
   a back end of line metal layer, comprising:
      contacts in a memory region connecting to a plurality of pillar-based memory devices;
      a first interlayer dielectric (ILD) material surrounding the contacts, wherein the first ILD material leaves gaps between the contacts; and
      a self-leveling dielectric material filling the gaps in the first ILD material; and
   an encapsulation dielectric material surrounding each of the plurality of pillar-based memory devices, wherein the self-leveling dielectric material is over the encapsulation dielectric material, and a plurality of top surfaces of: i) the self-leveling dielectric material, ii) the contacts, and iii) the first ILD material each have a same height.

15. The semiconductor structure of claim 14, further comprises:
   one or more portions of a first metal layer in a second interlayer dielectric material, wherein the one or more portions of the first metal layer reside in one of a logic region or the memory region of the semiconductor structure; and
   the first interlayer dielectric material is over the self-leveling dielectric material and between a plurality of contacts in the back end of line metal layer.

16. The semiconductor structure of claim 14, wherein the pillar-based memory devices are selected from the group consisting of: a magnetoresistive random-access memory device, a resistive random-access memory, and a phase change random-access memory device.

17. The semiconductor structure of claim 15, wherein the one or more portions of a first metal layer in the second interlayer dielectric material, further comprises:
   a dielectric cap material over the one or more portions of the first metal layer and the first dielectric material;
   a first portion of the one or more portions of the first metal layer in the first dielectric material is under each pillar-based memory device in the plurality of pillar-based memory devices; and
   a second portion of the one or more portions of the first metal layer is above one or more logic devices, wherein the second portion of the one or more portions of the first metal layer is adjacent to the first portion of the one or more portions of the first metal layer.

18. The semiconductor structure of claim 15, wherein the self-leveling dielectric material over the encapsulation dielectric material fills each gap between adjacent pillar-based memory devices in the plurality of pillar-based memory devices.

19. The semiconductor structure of claim 14, wherein the self-leveling dielectric material is a low-k dielectric constant, flowable chemical vapor deposited material.

* * * * *